United States Patent
Le Bellac et al.

(10) Patent No.: US 8,187,714 B2
(45) Date of Patent: May 29, 2012

(54) TRANSPARENT SUBSTRATE PROVIDED WITH AN ELECTRODE

(75) Inventors: David Le Bellac, Courbevoie (FR); Bertrand Kuhn, Compiegne (FR)

(73) Assignee: Saint-Gobain Glass France, Courbevoie (FR)

( * ) Notice: Subject to any disclaimer, the term of this patent is extended or adjusted under 35 U.S.C. 154(b) by 917 days.

(21) Appl. No.: 12/067,865

(22) PCT Filed: Sep. 19, 2006

(86) PCT No.: PCT/FR2006/050903
§ 371 (c)(1),
(2), (4) Date: Aug. 27, 2008

(87) PCT Pub. No.: WO2007/034110
PCT Pub. Date: Mar. 29, 2007

(65) Prior Publication Data
US 2008/0314442 A1     Dec. 25, 2008

(30) Foreign Application Priority Data

Sep. 23, 2005   (FR) ..................................... 05 52850

(51) Int. Cl.
*B32B 17/06*     (2006.01)
(52) U.S. Cl. ......... 428/432; 428/428; 428/697; 428/699

(58) Field of Classification Search ................. 428/426, 428/428, 432
See application file for complete search history.

(56) References Cited

U.S. PATENT DOCUMENTS

| | | | |
|---|---|---|---|
| 5,078,803 A * | 1/1992 | Pier et al. ...................... | 136/256 |
| 6,403,147 B1 | 6/2002 | McCurdy et al. | |
| 2005/0025982 A1 | 2/2005 | Krisko et al. | |
| 2005/0130416 A1 | 6/2005 | Fujisawa et al. | |

FOREIGN PATENT DOCUMENTS

| | | |
|---|---|---|
| FR | 2 832 706 | 5/2003 |
| GB | 2 252 332 | 8/1992 |
| JP | 3573392 | 10/2004 |

OTHER PUBLICATIONS

Rajesh Das, et al., "Degradation Studies of Transparent Conducting Oxide: A Substrate for Microcrystalline Silicon Thin Film Solar Cells", Solar Energy Materials & Solar Cells, Elsevier Science Publishers, vol. 86, No. 2, XP 004692287, pp. 207-216, 2005.

* cited by examiner

*Primary Examiner* — Gwendolyn Blackwell
(74) *Attorney, Agent, or Firm* — Oblon, Spivak, McClelland, Maier & Neustadt, L.L.P.

(57) ABSTRACT

Transparent substrate, especially made of glass, associated with an electrode, especially one suitable for solar cells, characterized in that the electrode comprises a first transparent electrically conducting layer composed of an undoped mineral oxide, said first layer being coated with a second transparent electrically conducting layer composed of the same mineral oxide, said mineral oxide however being doped.

15 Claims, 1 Drawing Sheet

TRANSPARENT SUBSTRATE PROVIDED WITH AN ELECTRODE

BACKGROUND OF THE INVENTION FIELD OF THE INVENTION

The invention relates to a transparent substrate, especially made of glass, which is provided with an electrode. This conducting substrate is most particularly intended to form part of solar cells.

DESCRIPTION OF THE RELATED ART

As is known, solar cells based on thin layers of silicon (Si) or cadmium telluride (CdTe) incorporate this type of conducting substrate.

For cells incorporating Si or CdTe using thin-film technology, thin electrically conducting transparent layers, commonly called TCO (Transparent Conductive Oxide) layers based on $SnO_2$:F, $SnO_2$:Sb, ZnO:Al or ZnO:Ga are used. They are typically used as the front electrode for solar cells based on thin silicon layers. The $SnO_2$:F is deposited by CVD and the ZnO:Al is deposited by magnetron sputtering. The latter compound requires an acid etch post-treatment in order to roughen it, whereas the $SnO_2$:F is naturally rough after deposition. This roughness makes it possible to generate a light-trapping effect so as to increase the light absorption by the silicon, which constitutes the active part of the solar cell. This parameter is one of the performance criteria of a TCO layer with respect to this light-trapping effect, this criterion being characterized by the intensity of the haze obtained.

Various approaches are known in searching for improved haze of TCO layers intended for applications in the photovoltaic field, especially those illustrated by document FR 2 832 706 which discloses structures of haze-inducing rough transparent conducting layers with an RMS roughness>3 nm and a feature size>50 nm.

EP 1 422 761 discloses the use in the multilayer of an irregular $SnO_2$/SiOC or SiOC or SiSnO sublayer.

Moreover, document EP 1 056 136 teaches the use of an $SnO_2$/$SiO_2$ sublayer on an Na-based glass substrate for generating holes from NaCl crystals.

Whatever the approach from the prior art, the production of a multilayer structure with haze requires either an $SiSn_xO_yC_y$ sublayer or the texturing of the substrate before deposition of the TCO layer. This requires additional fabrication steps.

Another criterion commonly encountered in assessing the performance of a TCO layer for photovoltaic applications is the ratio of light transmission to electrical resistance.

In this regard, document EP 2 90 345 discloses a thin-film multilayer of the TCO type, based on an $SnO_2$/$SnO_2$:F bilayer, for which the light transmission/electrical resistance ratio is optimized.

BRIEF SUMMARY OF THE INVENTION

The object of the invention is to obtain a substrate provided with an electrode intended for solar cells, which is simpler to fabricate and/or less expensive than the known electrodes, and the combined performance characteristics of the electrode, in terms of the product of haze and light transmission, the light transmission/electrical resistance ratio, the haze/electrical resistance ratio and the haze, are concomitantly improved.

The first subject of the invention is a transparent substrate, especially made of glass, associated with an electrode, especially one suitable for solar cells, characterized in that the electrode comprises a first transparent electrically conducting layer composed of an undoped mineral oxide, said first layer being coated with a second transparent electrically conducting layer composed of the same mineral oxide, said mineral oxide however being doped.

Within the context of the invention, the term "layer" is understood to mean either a continuous layer or a discontinuous layer, especially one having features (either formed by etching a continuous layer, or by direct deposition of the discontinuous layer with the desired feature, for example using a mask system). This applies to all the layers involved in the present application.

In preferred embodiments of the invention, one or more of the following arrangements may optionally be furthermore employed:
- the electrode possesses a haze of between 5% and 25%, preferably between 10 and 20%;
- the electrode possesses a factor, the product of the haze (H) and the light transmission ($T_L$) expressed in a graph $H(T_L)$, which is above a line defined by the following pairs of coordinates: (15,82); (10,84); and (6,85);
- the product of the light absorption multiplied by the electrical surface resistance of the electrode is less than $0.6\Omega/\square$;
- the electrode has a resistance per square (R/$\square$) of $15\Omega/\square$ or less, especially $12\Omega/\square$ or less and preferably equal to 10 or $12\Omega/\square$ or less;
- the thickness of the first layer based on an undoped mineral oxide is between 150 and 900 nm;
- the first layer is based on tin oxide ($SnO_2$) and the second layer is based on fluorine-doped tin oxide ($SnO_2$:F);
- the electrode is deposited on a sublayer possessing alkali-metal barrier properties, of the silicon nitride or oxynitride, aluminum nitride or oxynitride or silicon oxide or oxinitride type, with a thickness between 20 and 150 nm;
- the barrier sublayer comprises an alternation of layers of high refractive index, between 1.9 and 2.3, with layers of low refractive index, between 1.4 and 1.7, especially in $Si_3N_4$/$SiO_2$ or $Si_3N_4$/$SiO_2$/$Si_3N_4$ sequences;
- the first layer is based on zinc oxide (ZnO) and the second layer is based on aluminum-doped zinc oxide (ZnO:Al);
- the doped and/or undoped tin oxide are/is deposited at high temperature, especially at a temperature above 600° C.;
- use of the substrate as described above as an Si- or CdTe-based photovoltaic cell electrode;
- the substrate is an extra-clear glass of the "Albarino" or "Diamant" type; and
- one of the faces of the substrate is coated with a multilayer which provides a functionality of the antireflection or hydrophobic or photocatalytic type.

DETAILED DESCRIPTION OF THE INVENTION

Figure 1:
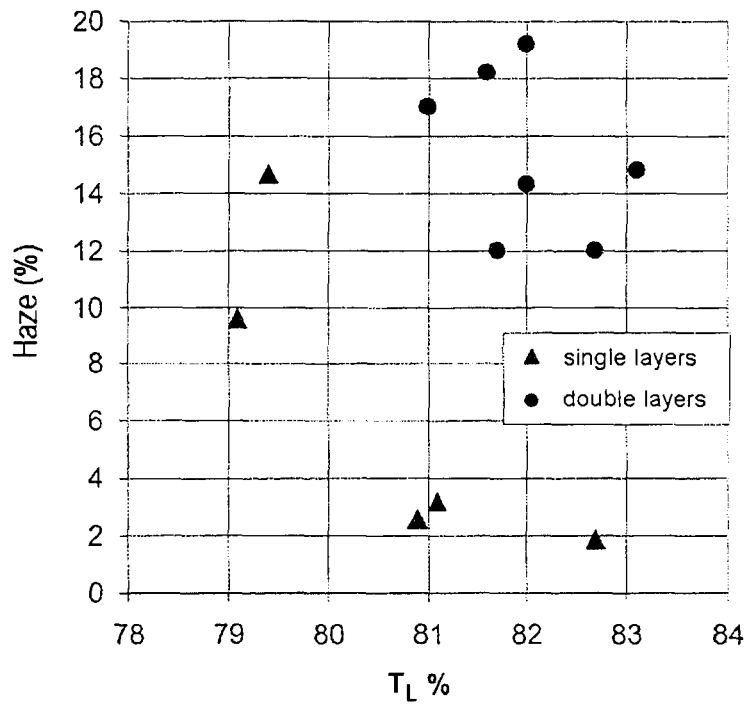
FIG. 1 illustrates haze (H) and light transmission ($T_L$) for various specimens having an $SnO_2$:F monolayer and an $SnO_2$:F bilayer, and an $SnO_2$/$SnO_2$:F bilayer.
Figure 2:
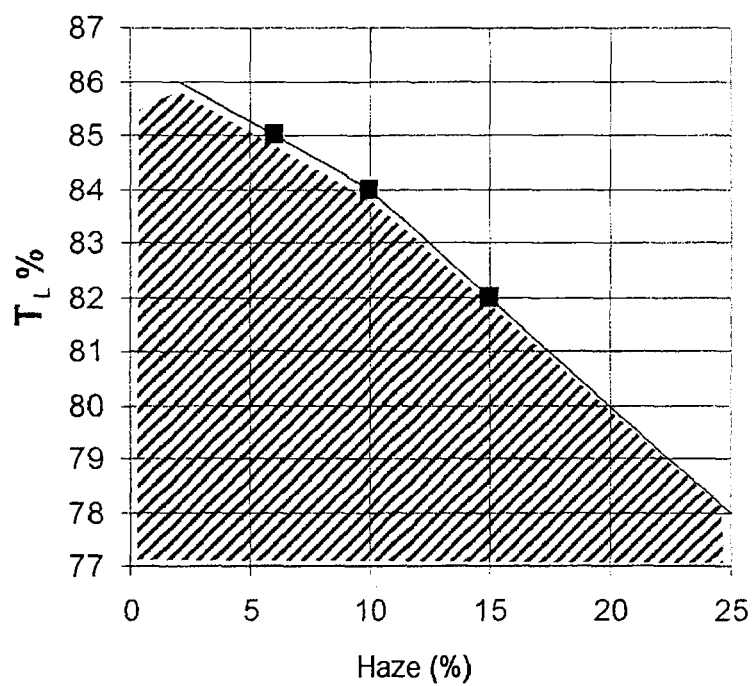
FIG. 2 illustrates a criterion between haze (H) and light transmission ($T_L$) for a second series of coatings.

The present invention will be more clearly understood on reading the following detailed description of nonlimiting illustrative examples and on examining FIGS. 1 and 2, which illustrate points of comparison between a multilayer structure having an $SnO_2$:F monolayer and an $SnO_2$:F bilayer on the one hand and an $SnO_2$/$SnO_2$:F bilayer on the other.

To produce the $SnO_2/SnO_2$:F-based bilayer electrode, after having raised the temperature of the substrate to above 600° C., a vapor mixture consisting of $(C_nH_{2n+1})_4Sn$, where n=1 to 4, $(CH_3)_2SnH_2$, $(C_4H_9)_3SnH$, $(C_4H_9)_2Sn(COOCH_3)_2$, $SnCl_4$, $(CH_3)_2SnCl_2$ or monobutyl tin trichloride (MBTCl) and water vapor, oxygen and nitrogen is decomposed.

The partially coated substrate is then heated again and brought into contact with a fluorinated tin compound or with a tin compound and a fluorocompound in order to obtain the $SnO_2$:F second layer.

To deposit the $SnO_2$:F layer, it is possible to use all the aforementioned tin compounds provided that a fluorine donor is added: $CF_3COOH$, HF, $CH_3CH_2F_2$, $CHClF_2$, $CH_3CClF_2$, $CHF_3$, $CF_2Cl_2$, $CF_3Cl$, $CF_3Br$.

To bring these tin compounds into contact with heated transparent substrates and to cause oxidation and thermal decomposition, the CVD (Chemical Vapor Deposition) method is used, whereby a vapor of tin compounds and an oxidizing gas are brought into contact with a transparent substrate at high temperature, or else the spraying method, whereby a solution of the tin compound is sprayed onto the transparent substrate at high temperature using a sprayer.

It is preferred to use the CVD method whereby a mixture of tin compound vapor, oxidizing gas, etc. is brought into contact with the transparent substrate heated to a temperature of 400 to 700° C., preferably near the temperature range between 600 and 680° C. A transparent electrically conducting film consisting of two layers is thus deposited, i.e. an $SnO_2$ layer followed by an $SnO_2$:F layer deposited on top.

According to the present invention, the thickness of the $SnO_2/SnO_2$:F bilayer film is 0.6 to 1.5 microns.

EXAMPLES

A series of coatings were deposited, on a glass substrate of the "Albarino" and/or "Diamant" type, Diamant and Albarino being registered trademarks of the Applicant of the present patent application for a glass substrate of the extra-clear type and a glass substrate of the type possessing surface reliefs respectively, using the following methods.

The first series of coatings comprised a single $SnO_2$:F layer deposited at high temperature (at least above 600° C.) by CVD, by decomposing precursors based on such as those mentioned above +air+$H_2O$+a fluorocompound.

The $T_L$ and haze (H) measurements were made with a hazemeter. The following series of specimens was obtained:

| Specimen | Resistance per square ($\Omega/\square$) | $T_L$(%) | Haze or H(%) | $(SnO_2:F)$ thickness (nm) |
|---|---|---|---|---|
| 1 | 6.1 | 79.4 | 14.7 | 1340 |
| 2 | 9.5 | 82.7 | 1.9 | 580 |
| 3 | 7.8 | 81.1 | 3.2 | 685 |
| 4 | 6.3 | 79.1 | 9.6 | 1050 |
| 5 | 8.0 | 80.9 | 2.6 | 660 |

A series of multilayer coatings, of the $SnO_2/SnO_2$:F bilayer type was then deposited on a glass substrate of the "Albarino" and/or "Diamant" type, under the same operating conditions as previously (the respective thicknesses ranging from 25%/75% to 75%/25% for total thicknesses ranging from 750 to 1000 nm). The following specimens were obtained:

| Specimen | Resistance per square ($\Omega/\square$) | $T_L$(%) | Haze or H(%) |
|---|---|---|---|
| 6 | 9.7 | 83.1 | 14.8 |
| 7 | 10.0 | 81.0 | 17.0 |
| 8 | 7.7 | 82.0 | 14.3 |
| 9 | 10.5 | 82.0 | 19.2 |
| 10 | 11.2 | 81.6 | 18.2 |
| 11 | 7.8 | 81.7 | 12.0 |
| 12 | 9.2 | 82.7 | 12.0 |

| Specimen | $(SnO_2)$ thickness (nm) | $(SnO_2:F)$ thickness (nm) |
|---|---|---|
| 6 | 180 | 530 |
| 7 | 610 | 240 |
| 8 | 170 | 530 |
| 9 | 600 | 340 |
| 10 | 640 | 360 |
| 11 | 180 | 600 |
| 12 | 250 | 510 |

The measurements show that, for all the specimens, much better performance (concomitantly higher haze and $T_L$) is achieved with the bilayers than with the monolayers. This situation is illustrated by the graph in FIG. 1.

In the case of the second specimens, the following values of carrier mobility, carrier density, haze and $T_L$, measured by a spectrophotometer, were obtained, showing that the performance is concomitantly very satisfactory (high mobility, moderate density, high $T_L$, high haze):

| Specimen | Carrier mobility ($cm^2/V/s$) | Carrier density ($10^{20}$ $cm^{-3}$) | $T_L$ (%) | Haze (%) |
|---|---|---|---|---|
| 6 | 37.6 | 2.25 | 85.4 | 15.6 |
| 7 | 40.6 | 1.75 | 84.0 | 18.7 |
| 8 | 39.9 | 2.8 | 84.1 | 16.1 |
| 9 | 38.9 | 1.7 | 84.4 | 20.0 |
| 10 | 36.8 | 1.8 | 84.3 | 18.4 |
| 11 | 36.6 | 2.7 | 83.6 | 15.1 |
| 12 | 33.9 | 2.2 | 85.0 | 13.1 |

For specimens of the second series of coatings (specimens 6 to 12), it is proposed to define a second criterion, expressing the relationship between H or haze and the light transmission. As is apparent in FIG. 2, all the specimens are above the curve defined by the pairs of coordinates (15,82); (10,84); and (6,85) (the unhatched region).

Given below are other comparative examples showing the influence of the doping on the value of the haze obtained and the influence of the production temperature on the haze (the optical measurements being carried out using a hazemeter).

Thus, the first example below shows the difference between a conventional $SnO_2$:F layer deposited at high temperature T1 (above 600° C.) and the same layer produced without doping.

| | Dopant flow rate (kg/h) | Haze |
|---|---|---|
| $SnO_2$:F | 8 | 0.94 |
| $SnO_2$ (no doping) | 0 | 4.93 |

The second example below shows the effect of the temperature on the generation of haze. The conventional layer was produced at a temperature T2 at least 30° C. above T1.

| | Dopant flow rate (kg/h) | Haze |
|---|---|---|
| $SnO_2$:F | 8 | 1.8 |
| $SnO_2$ (no doping) | 0 | 8.45 |

The haze value is increased by almost a factor of 2 ongoing from T1 to T2.

The third example shows the relationship between the dopant flow rate and the haze for a thick layer deposited at high temperature (above 600° C.).

| Dopant flow rate (kg/h) | Haze (%) | $T_L$ (%) |
|---|---|---|
| 0 | 20.8 | 78.5 |
| 1.6 | 13.3 | 77.1 |
| 2 | 12.7 | 76.8 |
| 3 | 8.45 | 75.8 |
| 4 | 7.63 | 75.6 |
| 6 | 6.05 | 74.6 |

It may be seen that the doping decreases the $T_L$. The more the layer is doped, the greater the absorption by the charge carriers.

In conclusion, the fact of not doping the layer increases the haze. Moreover, the temperature also has the effect of increasing the haze.

Within the bilayer strategy, the $SnO_2$ sublayer is therefore used to create the conditions favorable to haze. At the same time, the $SnO_2$ sublayer favors a high light transmission. The $SnO_2$:F overlayer is present to adjust the resistance per square of the TCO.

To produce a ZnO/ZnO:Al bilayer, at least one dielectric layer is deposited on the substrate by sputtering, especially magnetically enhanced or magnetron sputtering, and preferably reactive sputtering in the presence of oxygen and/or nitrogen, in a sputtering chamber.

The ZnO layer is obtained from a cathode consisting of a doped metal, that is to say one containing a minority element. As an illustration, it is common practice to use zinc cathodes containing a minor proportion of another metal, such as aluminum or gallium. The control parameters are the following: P=4.0 kW; I=40 A; U=360 V; gas (argon)=350 sccm. However, to create haze in the ZnO/ZnO:Al bilayer, it is necessary to texturize the ZnO first layer by acid etching.

As a variant, it is possible to deposit subsequently, by magnetron sputtering on the $SnO_2$/$SnO_2$:F bilayer, a ZnO overlayer, this overlayer being a layer for protecting against tap by the hydrogen plasma and having a thickness between 10 and 50 nm, preferably about 20 nm.

As a result, according to the present invention, it is possible to obtain transparent electrically conducting films of low electrical resistance and having a high light transmission and a high haze value.

According to one embodiment of the invention, it may be judicious to functionalize the other face of the substrate (the one not coated with the bilayer according to the invention).

Thus, thin layers are deposited on the surface that are intended to give a particular property such as, for example, that consisting in allowing the substrate to remain as clean as possible, whatever the environmental attack, that is to say with the aim of maintaining surface and appearance properties over time, and in particular allowing the cleaning operations to be spaced apart, while succeeding in removing any soiling matter as it is being progressively deposited on the surface of the substrate, especially soiling matter of organic origin, such as fingerprints or volatile organic substances present in the atmosphere, or even soiling matter of the pollution dust or soot type.

Now, it is known that there are certain metal-oxide-based semiconductor materials that are capable, under the effect of radiation of suitable wavelength, to initiate radical reactions that cause organic substances to oxidize. These are generally called "photocatalytic" or "photoreactive" materials.

In the field of substrates having a glazing function, it is known to use photocatalytic coatings on the substrate that have a pronounced "antisoiling" effect and can be manufactured on an industrial scale. These photocatalytic coatings generally include at least partly crystallized titanium oxide, incorporated into said coating in the form of particles, especially with a size of between a few (3 or 4) nanometers and 100 nm, preferably around 50 nm, these being essentially crystallized in anatase or anatase/rutile form.

Titanium oxide falls within semiconductors that, under the action of light in the visible or ultraviolet range, degrade organic compounds deposited on their surface.

Thus, according to a first exemplary embodiment, the coating with a photocatalytic property results from a solution based on $TiO_2$ nanoparticles and a mesoporous silica ($SiO_2$) binder.

According to a second exemplary embodiment, the coating with a photocatalytic property results from a solution based on $TiO_2$ nanoparticles and an unstructured silica ($SiO_2$) binder.

Furthermore, whatever the embodiment of the photocatalytic coating, as regards the titanium oxide particles the choice falls on titanium oxide that is at least partly crystallized because it has been shown that this is much more efficient in terms of photocatalytic activity than amorphous titanium oxide. Preferably, it is crystallized in anatase form, in rutile form or in the form of an anatase/rutile mixture.

The manufacture of the coating is carried out so that the crystallized titanium oxide that it contains is in the form of "crystallites", that is to say single crystals, having a mean size of between 0.5 and 100 nm, preferably 3 to 60 nm. This is because it is within this size range that the titanium oxide appears to have the optimum photocatalytic effect, probably because the crystallites of this size develop a large active surface area.

The coating with a photocatalytic property may also include, apart from titanium oxide, at least one other type of mineral material, especially in the form of an amorphous or partly crystallized oxide, for example silicon oxide (or a mixture of silicon oxides), titanium oxide, tin oxide, zirconium oxide or aluminum oxide. This mineral material may also contribute to the photocatalytic effect of the crystallized titanium oxide, by itself having a certain photocatalytic effect, even though small compared with that of crystallized $TiO_2$, which is the case for amorphous or partly crystallized titanium oxide.

It is also possible to increase the number of charge carriers by doping the crystal lattice with titanium oxide, inserting thereinto at least one of the following metallic elements: niobium, tantalum, iron, bismuth, cobalt, nickel, copper, ruthenium, cerium and molybdenum.

This doping may also be carried out by doping only the surface of the titanium oxide or the entire coating, surface doping being carried out by covering at least some of the coating with layers of oxides or metal salts, the metal being chosen from iron, copper, ruthenium, cerium, molybdenum, vanadium and bismuth.

Finally, the photocatalytic effect may be enhanced by increasing the yield and/or rate of the photocatalytic reactions, while covering the titanium oxide or at least part of the coating that incorporates it with a noble metal in the form of a thin layer of the platinum, rhodium or silver type.

The coating with a photocatalytic property also has an external surface of pronounced hydrophilicity and/or oleophilicity, especially in the case in which the binder is a mineral binder, thereby providing two not insignificant advantages: hydrophilicity allows perfect wetting by water, which can be deposited on the coating, thus making cleaning easier.

In addition to hydrophilicity, it may also exhibit oleophilicity, allowing the "wetting" of organic soiling matter which, as in the case of water, then tends to be deposited on the coating in the form of a continuous film that is less visible than highly localized "stains". What is thus obtained is an "organic antisoiling" effect that takes place in two stages. First, as soon as the soiling matter is deposited on the coating, it already becomes barely visible and then it progressively disappears by photocatalytically initiated radical degradation.

The thickness of the coating can vary between a few nanometers and a few microns, typically between 50 nm and 10 μm.

In fact, the choice of thickness may depend on various parameters, especially on the envisaged application of the substrate or on the size of the $TiO_2$ crystallites in the coating. The coating may also be chosen to have a relatively smooth surface—a slight surface roughness may in fact be advantageous if it allows a larger photocatalytically active surface area to develop. However, too pronounced a roughness may be prejudicial, by promoting the incrustation and accumulation of soiling matter.

According to another embodiment, the functionality applied to the other face of the substrate may consist of an antireflection coating thus making it possible to maximize the efficiency of energy conversion.

Given below are the preferred ranges of the geometric thicknesses and indices of the four layers of the antireflection multilayer coating according to the invention, this multilayer coating being called A:

$n_1$ and/or $n_3$ are between 2.00 and 2.30, especially between 2.15 and 2.25 and preferably close to 2.20;
$n_2$ and/or $n_4$ are between 1.35 and 1.65;
$e_1$ is between 5 and 50 nm, especially between 10 and 30 nm, or between 15 and 25 nm;
$e_2$ is between 5 and 50 nm, especially less than or equal to 35 nm or 30 nm, in particular being between 10 and 35 nm;
$e_3$ is between 40 and 180 nm and preferably between 45 and 150 nm; and
$e_4$ is between 45 and 110 nm and preferably between 70 nm and 105 nm.

The most appropriate materials for forming the first and/or third layers of multilayer coating A, which is of the antireflection type, those having a high index are based on a silicon zirconium mixed nitride or on a blend of these mixed nitrides. As a variant, these high-index layers are based on silicon tantalum mixed nitrides or on a blend of the latter. All these materials may optionally be doped in order to improve their chemical and/or mechanical and/or electrical resistance properties.

The most appropriate materials for forming the second and/or the fourth layer of the multilayer coating A, those of low index are based on silicon oxide, silicon oxinitride and/or silicon oxicarbide or else based on a silicon aluminum mixed oxide. Such a mixed oxide tends to have better durability, especially chemical durability, than pure $SiO_2$ (an example of this is given in patent EP-791 562). The respective proportions of the two oxides may be adjusted so as to obtain the expected improvement in durability, without excessively increasing the refractive index of the layer.

A preferred embodiment of this antireflection multilayer coating is of the substrate/$Si_3N_4$/$SiO_2$/$Si_3N_4$/$SiO_2$ form, it being understood that the choice of the various thicknesses, and especially the thicknesses of the third and fourth layers, is optimized so that the light transmission lies within the largest part of the spectrum (namely in the visible and in the infrared)

The invention claimed is:

1. A transparent substrate, associated with an electrode, the electrode comprising:
    a first transparent electrically conducting layer composed of an undoped mineral oxide, the first layer being coated with a second transparent electrically conducting layer composed of the same mineral oxide, the mineral oxide being doped,
    wherein the electrode possesses a factor, based on haze (H(%)) and light transmission($T_L$), which is defined by the following equations:

$0.25 \times H(\%) + T_L > 86.5\ 0 < H(\%) < 10$ $0.4 \times H(\%) + T_L > 88\ H(\%) \geq 10.$ 2. The substrate as claimed in claim 1, wherein the electrode possesses a haze of between 5% and 25%.

3. The substrate as claimed in claim 1, wherein a product of a light absorption of the electrode multiplied by an electrical surface resistance of the electrode is less than 0.6Ω/□.

4. The substrate as claimed in claim 1, wherein a thickness of the first layer based on an undoped mineral oxide is between 150 and 900 nm.

5. The substrate as claimed in claim 1, wherein the first layer is based on tin oxide ($SnO_2$) and the second layer is based on fluorine-doped tin oxide ($SnO_2$:F).

6. The substrate as claimed in claim 1, wherein the first layer is based on zinc oxide (ZnO) and the second layer is based on aluminum-doped zinc oxide (ZnO:Al).

7. The substrate as claimed in claim 1, further comprising at least one barrier layer, acting as a barrier to alkali metals, inserted between the substrate and the electrode.

8. The substrate as claimed in claim 7, wherein the barrier layer is based on a dielectric, chosen from at least one of the following compounds:
    silicon nitride or oxinitride, silicon oxide or oxicarbide.

9. The substrate as claimed in claim 7, wherein the barrier layer forms part of a multilayer coating with an optical function, including at least two layers of dielectrics having different refractive indices.

10. The substrate as claimed in claim 1, wherein the doped and/or undoped mineral oxide are/is deposited at a temperature above 600° C., by CVD.

11. The substrate as claimed in claim 1, further comprising at least one overlayer based on zinc oxide, the overlayer being deposited on the second layer which is based on fluorine-doped tin oxide ($SnO_2$:F).

12. The substrate as claimed in claim 1, wherein the substrate is an extra-clear glass.

13. The substrate as claimed in claim 1, wherein one of faces of the substrate is coated with a multilayer that provides a functionality of antireflection or hydrophobic or photocatalytic type.

14. A solar cell, comprising the substrate as claimed in claim 1.

15. The substrate as claimed in claim 2, wherein the electrode possesses a haze of between 10% and 20%.

* * * * *